(12) United States Patent
Ninomiya et al.

(10) Patent No.: US 9,601,314 B2
(45) Date of Patent: Mar. 21, 2017

(54) ION IMPLANTATION APPARATUS AND ION IMPLANTATION METHOD

(75) Inventors: Shiro Ninomiya, Tokyo (JP); Tetsuya Kudo, Tokyo (JP)

(73) Assignee: SEN CORPORATION, Tokyo (JP)

( * ) Notice: Subject to any disclaimer, the term of this patent is extended or adjusted under 35 U.S.C. 154(b) by 95 days.

(21) Appl. No.: 13/495,888

(22) Filed: Jun. 13, 2012

(65) Prior Publication Data

US 2012/0322248 A1   Dec. 20, 2012

(30) Foreign Application Priority Data

Jun. 14, 2011   (JP) ................................. 2011-132216

(51) Int. Cl.
  *H01J 37/317*   (2006.01)
(52) U.S. Cl.
  CPC . *H01J 37/3171* (2013.01); *H01J 2237/20214* (2013.01); *H01J 2237/20228* (2013.01); *H01J 2237/30483* (2013.01); *H01J 2237/3171* (2013.01)
(58) Field of Classification Search
  CPC ............... H01J 37/3171; H01J 37/3172; H01J 2237/20228; H01L 21/265; H01L 21/26586
  USPC .................................................. 438/514, 525
  See application file for complete search history.

(56) References Cited

U.S. PATENT DOCUMENTS

2005/0184254 A1* 8/2005 Matsumoto et al. .... 250/492.21
2005/0250299 A1  11/2005 Sohn et al.
2006/0057303 A1   3/2006 Agarwal et al.
2008/0157681 A1*  7/2008 Huang et al. .................. 315/119
2012/0196428 A1*  8/2012 Asai et al. ..................... 438/527

FOREIGN PATENT DOCUMENTS

| CN | 1697136 A | 11/2005 |
|---|---|---|
| JP | 2003-86530 A | 3/2003 |
| JP | 2005-235682 A | 9/2005 |
| JP | 2005-328048 A | 11/2005 |
| JP | 2007-184596 A | 7/2007 |

(Continued)

OTHER PUBLICATIONS

Japanese Office Action, dated May 7, 2014, issued in Japanese Patent Application No. 2011-132216.

(Continued)

*Primary Examiner* — Scott B Geyer
*Assistant Examiner* — Brigitte Paterson
(74) *Attorney, Agent, or Firm* — Arent Fox LLP

(57) ABSTRACT

An ion implantation method in which an ion beam is scanned in a beam scanning direction and a wafer is mechanically scanned in a direction perpendicular to the beam scanning direction, includes setting a wafer rotation angle with respect to the ion beam so as to be varied, wherein a set angle of the wafer rotation angle is changed in a stepwise manner so as to implant ions into the wafer at each set angle, and wherein a wafer scanning region length is set to be varied, and, at the same time, a beam scanning speed of the ion beam is changed, in ion implantation at each set angle in a plurality of ion implantation operations during one rotation of the wafer, such that the ions are implanted into the wafer and dose amount non-uniformity in a wafer surface in other semiconductor manufacturing processes is corrected.

14 Claims, 11 Drawing Sheets

(56) References Cited

FOREIGN PATENT DOCUMENTS

| JP | 2008-513955 A | 5/2008 |
|----|---------------|--------|
| JP | 2012-160386 A | 8/2012 |
| TW | 2010-41018 A1 | 11/2010 |

OTHER PUBLICATIONS

Chinese Office Action mailed Sep. 6, 2015 for Chinese Application No. 201210199695.1, with English Translation.
Taiwanese Office Action mailed on Dec. 3, 2015 for Taiwanese Application No. 2011-132216, with partial English translation.

* cited by examiner

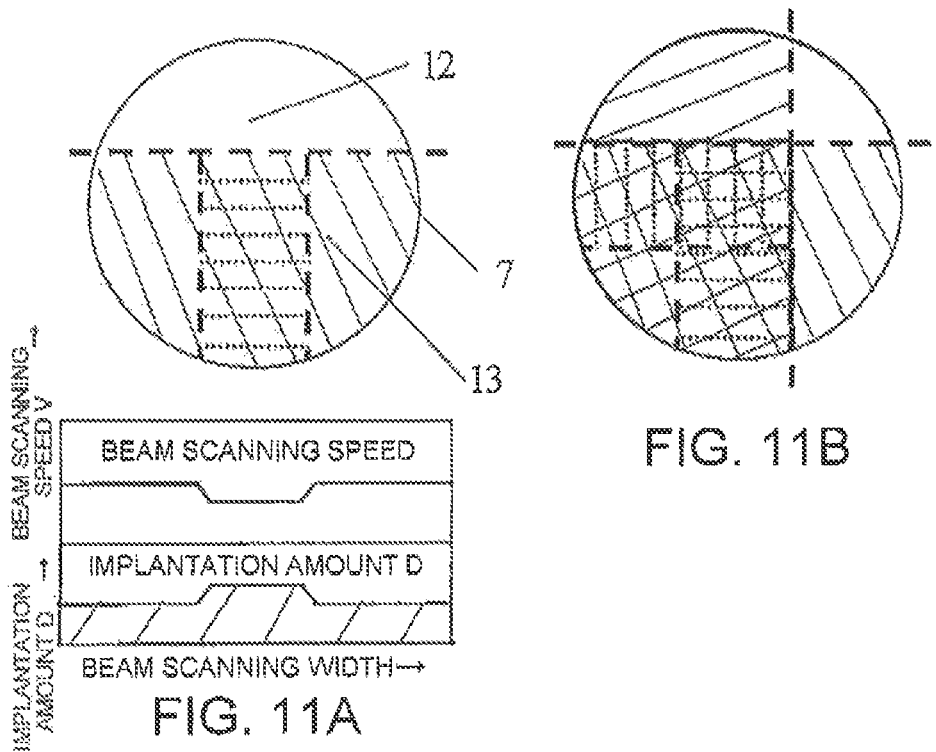
FIG. 11A
FIG. 11B
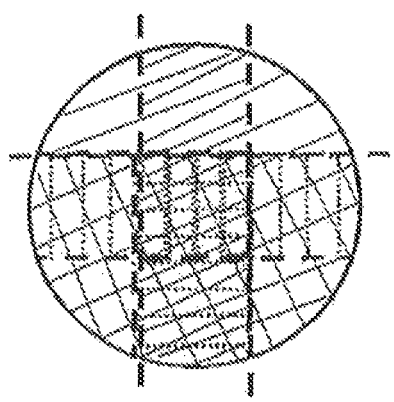
FIG. 11C
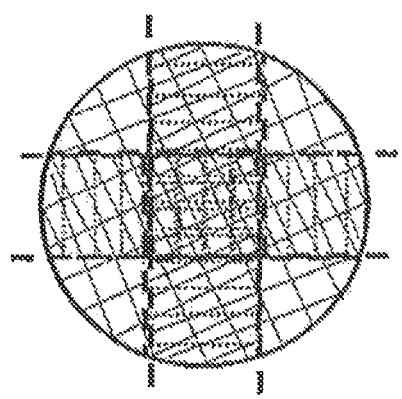
FIG. 11D
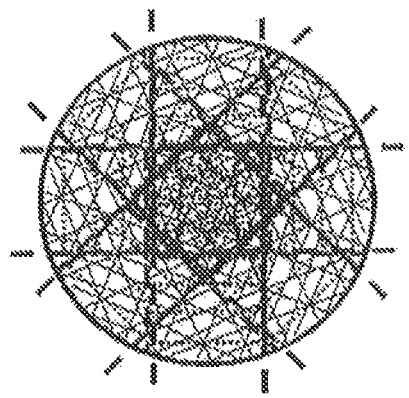
FIG. 11E

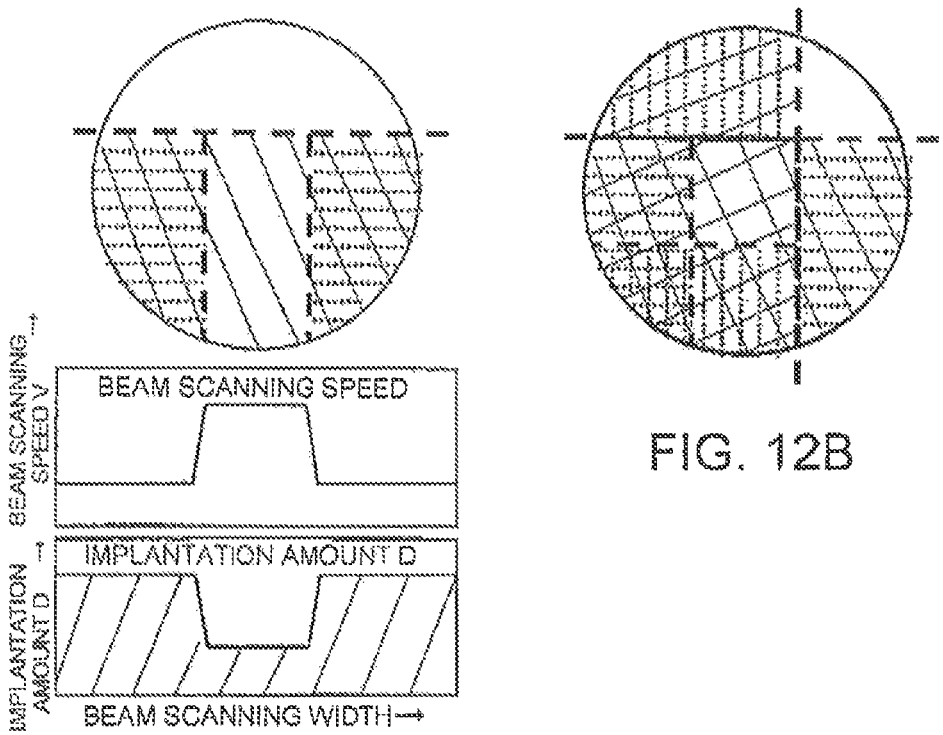
FIG. 12A
FIG. 12B
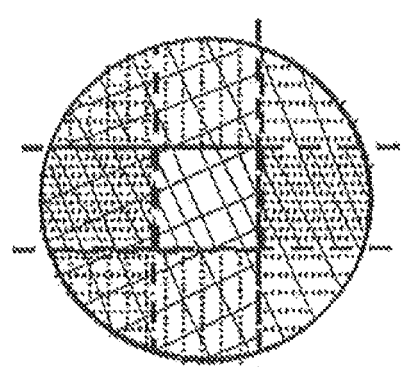
FIG. 12C
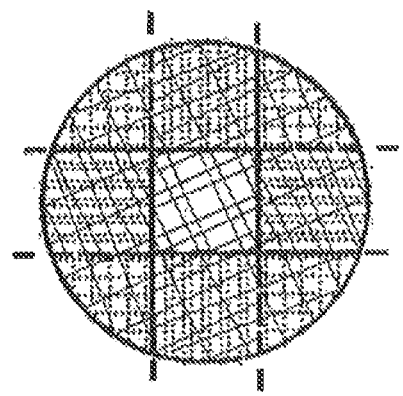
FIG. 12D
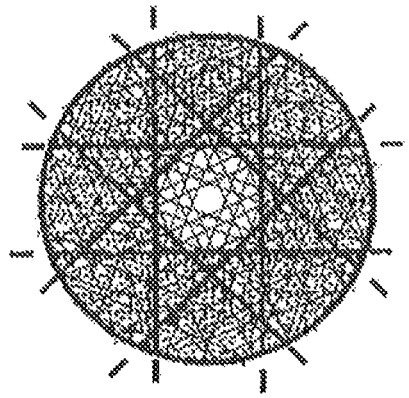
FIG. 12E

ION IMPLANTATION APPARATUS AND ION IMPLANTATION METHOD

This application is based upon and claims the benefit of priority from Japanese patent application No. 2011-132216, filed on Jun. 14, 2011, the disclosure of which is incorporated herein in its entirety by reference.

TECHNICAL FIELD

The present invention relates to an ion implantation apparatus and an ion implantation method, and more particularly to ion implantation amount control of the ion implantation apparatus.

BACKGROUND ART

In semiconductor manufacturing processes, a process for implanting ions into a semiconductor wafer is performed in a standard procedure for the purpose of varying conductivity, varying a crystalline structure of the wafer, or the like. An apparatus used in this process is called an ion implantation apparatus. The ion implantation apparatus has a function of generating ions using an ion source, and then forming an accelerated ion beam, and a function of irradiating the entire surface of the semiconductor wafer with the ion beam, through beam scanning, wafer scanning, or a combination thereof.

In the semiconductor manufacturing processes, in order to create semiconductor chips having the same performance across the entire surface of the wafer, typically, it is necessary to form a uniform condition in the wafer surface, in the ion implantation process, typically, the ion implantation apparatus is controlled such that an ion implantation amount implanted over the entire region of the wafer is made to be uniform.

In some semiconductor manufacturing processes, it is difficult to obtain uniform conditions in the wafer surface in principle, particularly, in recent years, miniaturization of the semiconductor chip has rapidly progressed, and as the difficulty in obtaining uniform conditions in the wafer surface has increased, the extent of non-uniformity also increases, if a uniform condition is formed in the wafer surface in other processes under such conditions, as a result, semiconductor chips having the same performance in the entire wafer surface cannot be created. For example, in the ion implantation process, when a typical ion implantation is performed for the entire region of the wafer such that an ion implantation amount in the surface is uniform, electrical characteristics of resultant semiconductor chips are not the seine as each other, and thus semiconductor chips having the same performance cannot be created.

Therefore, in a case where a uniform condition cannot be formed in the wafer surface in the other semiconductor manufacturing processes, in order to handle dose amount non-uniformity in the wafer surface, an intentional non-uniform two-dimensional ion implantation amount in-surface distribution (hereinafter, simply referred to as two-dimensional ion implantation amount in-surface distribution by omitting "intentional non-uniform" in some cases) may be created in the process of irradiating the entire wafer with an ion beam using the ion implantation apparatus, and the dose amount non-uniformity in the wafer surface may be corrected in the other semiconductor manufacturing processes. At this time it is important to employ an ion implantation apparatus and an ion implantation method having a function capable of handling both the size of the dose amount non-uniformity in the wafer surface and a two-dimensional non-uniform shape pattern thereof in the other semiconductor manufacturing processes.

As an example of the method of creating a two-dimensional ion implantation amount in-surface distribution in the wafer surface, there has been proposed a method of controlling a scanning speed by an ion beam and a scanning speed (mechanical scanning speed) by a semiconductor wafer (refer to Japanese Unexamined Patent Publication No, 2003-86530).

In an ion implantation method disclosed in Japanese Unexamined Patent Publication No. 2003-86530, only a scanning speed by an ion beam and a scanning speed by a semiconductor wafer are controlled. In this case, a control range of the scanning speed is restricted, and thereby a large-scale two-dimensional ion implantation amount in-surface distribution where a ratio of the maximum ion implantation amount to the minimum ion implantation amount in the wafer surface is five times or more cannot be realized.

In addition, since the ion implantation method disclosed in Japanese Unexamined Patent Publication No, 2003-86530 is aimed at creating regions having different ion implantation amounts on a wafer, patterns of ion implantation amounts which can be implemented in a wafer surface are restricted, and thus it does not have a function of creating a two-dimensional ion implantation amount in-surface distribution capable of handling a two-dimensional non-uniform shape pattern in other semiconductor manufacturing processes.

It is desirable to realize a two-dimensional ion implantation amount in-surface distribution where a ratio of the maximum ion implantation amount to the minimum ion implantation amount in the wafer surface is of a large scale.

Specific objects of the present invention are to realize the following.

1. To realize a large-scale two-dimensional ion implantation amount in-surface distribution where a ratio of the maximum ion implantation amount to the minimum ion implantation amount in the wafer surface is five times or more.

2. To provide a function capable of handling the degree of dose amount non-uniformity in a wafer surface in other semiconductor manufacturing processes.

3. To provide a function capable of handling a two-dimensional non-uniform shape pattern of dose amount non-uniformity in a wafer surface in other semiconductor manufacturing processes.

4. To control the function capable of handling the degree of dose amount non-uniformity in a wafer surface and the function capable of handling a two-dimensional non-uniform shape pattern independently from each other. For example, even if the degree of dose amount non-uniformity in a wafer surface is the same, a two-dimensional non-uniform shape pattern thereof can be varied, and, conversely, even if a two-dimensional non-uniform shape pattern is the same, the degree of dose amount non-uniformity in the wafer surface can be varied.

The present invention is applied to an apparatus which scans an ion beam in a beam scanning direction, mechanically scans a wafer in a direction substantially perpendicular to the beam scanning direction, and implants ions into the wafer.

According to an aspect of the present invention, an ion implantation method is provided, in the ion implantation method, an ion beam is scanned in a beam scanning direction and a wafer is mechanically scanned in a direction perpendicular to the beam scanning direction so as to implant ions into the wafer. The method comprises setting a wafer rotation angle with respect to the ion beam so as to be varied. A set angle of the wafer rotation angle is changed in a stepwise manner so as to implant ions into the wafer at each set angle. A wafer scanning region length for regulating a range where the wafer is mechanically scanned is set to be varied, and, at the same time, a beam scanning speed of the ion beam is changed, in ion implantation at each set angle in a plurality of ion implantation operations during one rotation of the wafer, such that the ions are implanted into the wafer and dose amount non-uniformity in a wafer surface in other semiconductor manufacturing processes is corrected.

According to another aspect of the present invention, an ion implantation method is provided. In the ion implantation method, an ion beam is scanned in a beam scanning direction and a wafer is mechanically scanned in a direction perpendicular to the beam scanning direction so as to implant ions into the wafer. The method comprises setting a wafer rotation angle with respect to the ion beam so as to be varied and setting a wafer scanning region length for regulating a range where the wafer is mechanically scanned so as to be varied. Ion implantation is performed multiple times for a partial region surface from one end side of the wafer to the set wafer scanning region length during one rotation of the wafer at an angle used as a reference of the wafer rotation angle and one or more set angles changed from the angle used as a reference. A combination of variable setting of the wafer scanning region length and change control of the beam scanning speed of the ion beam in ion implantation at each set angle is performed such that the ions are implanted into the wafer and dose amount non-uniformity in a wafer surface in other semiconductor manufacturing processes is corrected.

According to still another aspect of the present invention, an ion implantation apparatus includes a beam scanner scanning an ion beam in a beam scanning direction and a mechanical scanning system mechanically scanning a water in a direction perpendicular to the beam scanning direction and implant ions into the wafer. The apparatus comprises a rotation device that is provided in the mechanical scanning system and varies a wafer rotation angle with respect to the ion beam and a controller that has a function of controlling at least the beam scanner and the mechanical scanning system. The controller controls the rotation device such that a set angle of the wafer rotation angle with respect to the ion beam is changed in a stepwise manner so as to implant ions into the wafer at each set angle, controls the mechanical scanning system such that a wafer scanning region length for regulating a range where the wafer is mechanically scanned is set to be varied, and, at the same time, controls the beam scanner such that a beam scanning speed of the ion beam is changed, in ion implantation at each set angle in a plurality of ion implantation operations during one rotation of the wafer, such that the ions are implanted into the wafer and a dose amount in a direction where the wafer is mechanically scanned is controlled, thereby performing an adjustment of ion implantation amount distribution in a wafer surface.

BRIEF DESCRIPTION OF THE DRAWINGS

FIGS. 11A to 11E are diagrams illustrating an ion implantation scheme of performing the ion implantation method of simultaneously controlling the wafer scanning region length and the beam scanning speed each time a wafer rotation angle with respect to an ion beam is changed and of repeatedly performing the ion implantation method multiple times according to an embodiment of the present invention.

FIGS. 12A to 12E are diagrams illustrating an ion implantation scheme of performing the ion implantation method of simultaneously controlling the wafer scanning region length and the beam scanning speed each time a wafer rotation angle with respect to an or beam is changed and of repeatedly performing the ion implantation method multiple times according to an embodiment of the present invention.

DETAILED DESCRIPTION OF THE PREFERRED EMBODIMENTS

Figure 1:
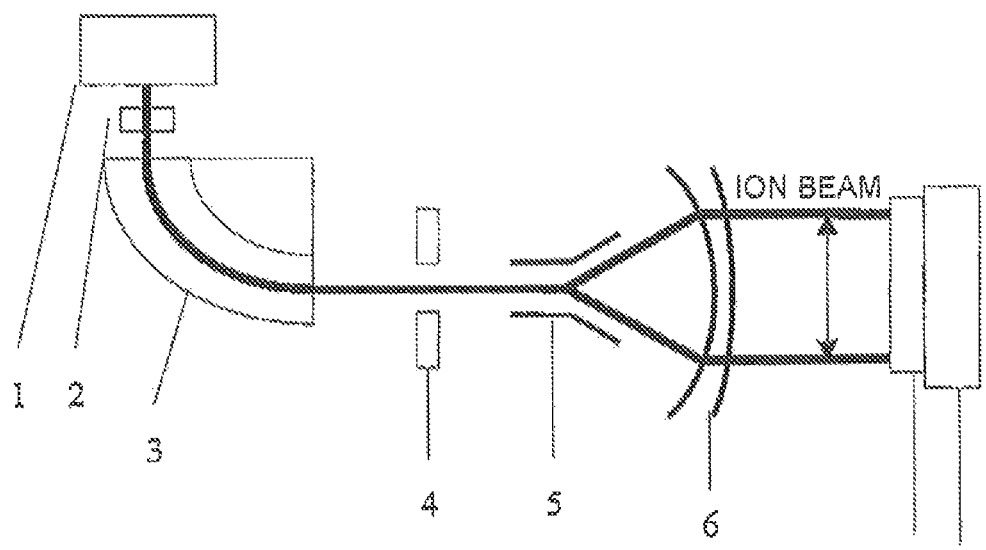
FIG. 1 is a plan view illustrating a schematic configuration of an example of the ion implantation apparatus to which the present invention is applicable.

Here, a schematic configuration of the ion implantation apparatus to which the present invention is applicable will be described with reference to FIG. 1. In the ion implantation apparatus to which the present invention is applicable, a mass spectrometry magnet device 3, a mass spectrometry slit 4, a beam scanner 5, and a wafer treatment chamber (ion implantation chamber) (not shown) are disposed in this order along a beam line such that an ion beam extracted from an ion source 1 by an extraction electrode 2 pass through the beam line reaching to a wafer 7. In the wafer treatment chamber, a mechanical scanning device having a mechanism including a holder 8 holding the wafer 7 is disposed. The ion beam extracted from the ion source 1 are guided to the wafer 7 on the holder 8 disposed at an ion implantation position of the wafer treatment chamber along the beam line.

The ion beam becomes parallel by a function of a parallel lens 6 after being scanned by the beam scanner 5 in the beam scanning direction, and then are guided to the wafer 7. In the ion implantation apparatus according to the embodiment of the present invention, the wafer 7 is mechanically scanned in a direction which is substantially perpendicular to the ion beam scanning direction, and thereby ions are implanted into the wafer 7. In FIG. 1, the wafer 7 may be scanned in the perpendicular direction to the figure.

Figure 2:
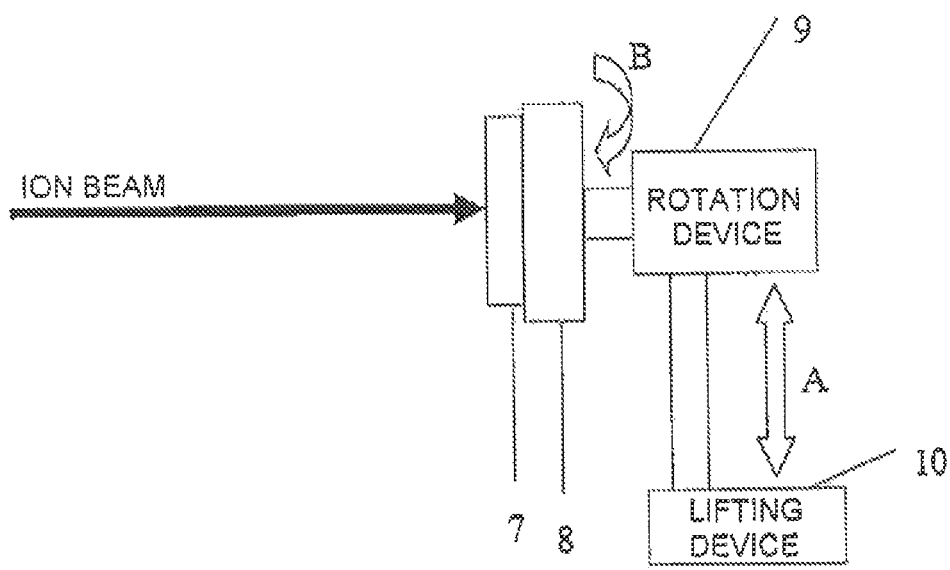
FIG. 2 is a side view illustrating, by enlargement, a schematic configuration of an example of the wafer periphery of the ion implantation apparatus shown in FIG. 1.

FIG. 2 is a side view illustrating, by enlargement, a schematic configuration of an example of the wafer periphery of the ion implantation apparatus shown in FIG. 1. In FIG. 2, the ion beam is scanned on the surface perpendicular to the figure and is applied to the wafer 7 held on the holder 8. The holder 8 is reciprocally driven in the arrow A direction in FIG. 2 by a lifting device 10, and, as a result, the wafer 7 held on the holder 8 is also reciprocally driven in the arrow A direction in FIG. 2. In other words, the ion beam is scanned in the beam scanning direction, and the wafer 7 is mechanically scanned in the direction substantially perpendicular to the beam scanning direction, thereby implanting ions into the entire surface of the wafer 7.

In addition, the ion implantation apparatus is provided with a rotation device 9 which rotates the holder 8 in the arrow B direction. As a result, the wafer 7 held on the holder 8 is also rotated with respect to the ion beam. In other words, the wafer 7 is rotated with respect to a central axis thereof as a center. The lifting device 10 reciprocally drives not only the wafer 7 and the holder 8 but also the rotation device 9 in the arrow A direction in FIG. 2.

Figure 3:
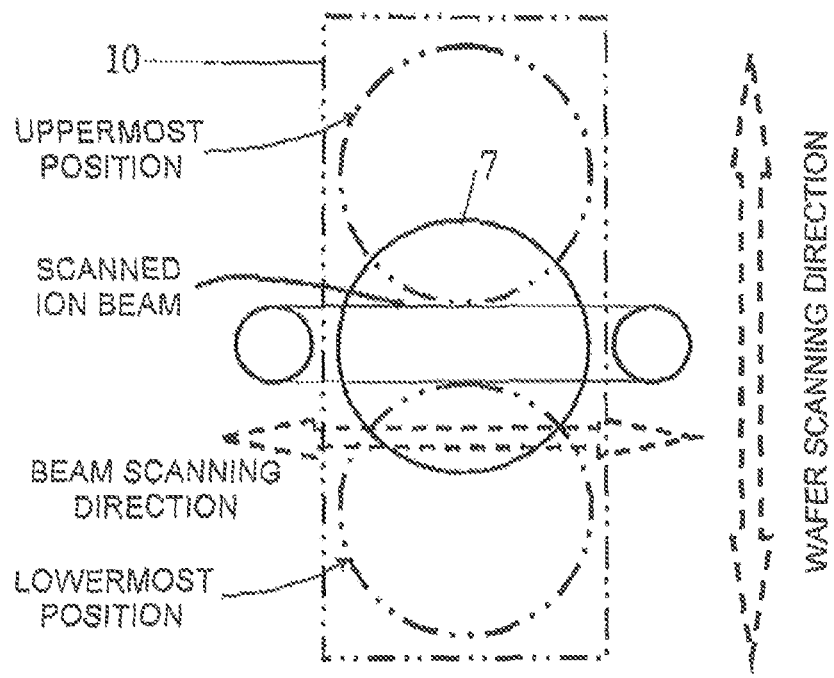
FIG. 3 is a diagram illustrating an ion beam scanning method and a wafer scanning method.

Here, an ion beam scanning method and a wafer scanning method will be described with reference to FIG. 3. In FIG. 3, only the scanned wafer 7, the scanned ion beam, and the lifting device 10 are shown, and the harder and the rotation device are not shown. In this example, the ion beam is scanned in the transverse direction, and the wafer 7 is scanned in the longitudinal direction. As shown in FIG. 3, in a typical ion implantation apparatus, the scanning region of the ion beam exceeds the wafer diameter, and a region where the wafer 7 is mechanically scanned is controlled such that the wafer 7 cuts across the ion beam irradiation region (the region indicated by the solid line as the scanned ion beam).

Although a control system of the ion implantation apparatus is not shown, control of a mechanical scanning device including the rotation device 9 and the lifting device 10 and, for example, control of a beam scanning speed in the beam scanner 5 are performed by a controller (not shown). For this reason, various measurement devices such as a sensor detecting a rotation angle of the rotation device 9, a sensor detecting a lifting position and a lifting speed of the lifting device 10, and a sensor measuring ion beam in the wafer treatment chamber, are installed, and the controller executes a control operation using results measured by the measurement devices.

The ion implantation apparatus according to the embodiment of the present invention is, as described above, an apparatus which scans the ion beam in the beam scanning direction, mechanically scans the wafer in the direction substantially perpendicular to the beam scanning direction, and implants ions into the wafer, but if an ion implantation amount implanted into the wafer is to be considered, a relative movement between the ion beam and the wafer is problematic. Therefore, for convenience of understanding, assuming that the wafer is static, an implantation region of the ion and a beam scanning speed may be considered relatively.

Figure 4:
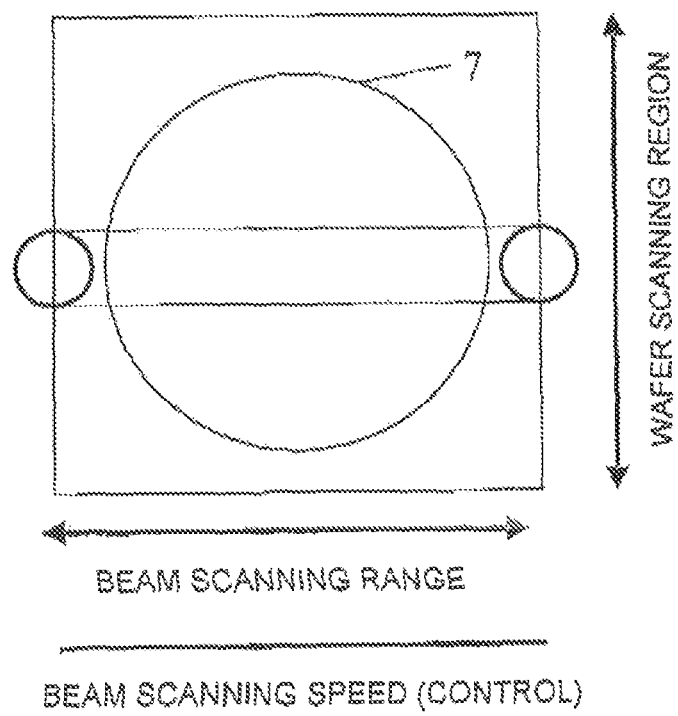
FIG. 4 is a diagram illustrating ion implantation for realizing dose amount uniformity in a wafer surface which is performed in the related art.

FIG. 4 is a diagram illustrating ion implantation for realizing dose amount uniformity in the wafer surface which is performed in the related art. In FIG. 4, it can be seen that the ion implantation region extends over the entire surface of the wafer 7 in the transverse direction as well as in the longitudinal direction. In other words, the convenient ion beam implantation region range includes the wafer shape.

In standard ion implantation for realizing dose amount uniformity in the wafer surface performed in the related art, in order to secure ion implantation amount uniformity in the transverse direction on the wafer, scanning speed of the ion beam is maintained to be nearly constant. In addition, in order to maintain uniformity in the longitudinal direction on the wafer, a scanning speed of the wafer, that is, a mechanical scanning speed is maintained to be nearly constant.

As an example of the method of creating an intentional non-uniform two-dimensional ion implantation amount in-surface distribution in a wafer surface (as described above, hereinafter, simply referred to as two-dimensional ion implantation amount in-surface distribution by omitting "intentional non-uniform"), a method of controlling a scanning speed of ion beam and a scanning speed of a semiconductor wafer may be considered. However, in this case since a control range of each scanning speed is restricted, a large-scale two-dimensional ion implantation amount in-surface distribution where a ratio of the maximum ion implantation amount to the minimum ion implantation amount in the wafer surface is five times or more, which is intended to be realized by certain embodiments of the present invention, cannot be realized.

Figure 5:
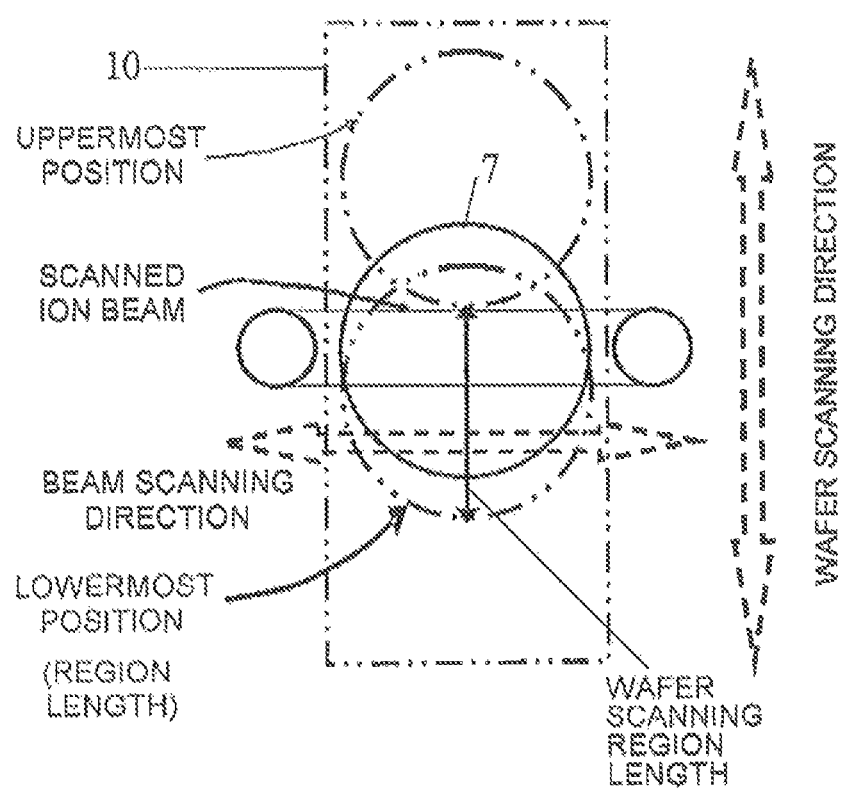
FIG. 5 is a diagram illustrating control of a wafer scanning region length for mechanically scanning a wafer according to an embodiment of the present invention.

In certain embodiments of the present invention, an ion implantation method is used in which a wafer is irradiated with ion beam while simultaneously controlling a wafer scanning region length for regulating a range where the wafer is mechanically scanned and a beam scanning speed in the beam scanning direction, and, first, with reference to FIG. 5, control of the wafer scanning region length for scanning the wafer 7 according to an embodiment of the present invention will be described. In FIG. 5, only the scanned wafer 7, the scanned ion beam and the lifting device 10 are shown, and the holder and the rotation device are not shown. In this example, the ion beam is scanned in the transverse direction and the wafer is scanned in the longitudinal direction.

As described in FIG. 3, in a typical ion implantation apparatus, the ion beam irradiation region exceeds the wafer diameter, and a region where the wafer 7 is mechanically scanned is controlled such that the wafer 7 cuts across the ion beam irradiation region. In contrast, in certain embodiments of the present invention, the ion beam irradiation region exceeds the wafer diameter in the same manner as the typical ion implantation apparatus, but the region where the wafer 7 is mechanically scanned is controlled such that the wafer 7 does not completely cut across the ion beam irradiation region. FIG. 5 shows that when the wafer 7 arrives at the lowermost position indicated by the two-dot chain line, the wafer 7 does net completely cut across the ion beam irradiation region. However, this is an example, and when the wafer 7 arrives at the uppermost position indicated by the two-dot chain line different from it, the wafer 7 may not completely cut across the ion beam irradiation region, or the wafer 7 may not completely cut across the ion beam irradiation region in either the wafer uppermost position or the wafer lowermost position.

Here, with reference to FIGS. 6A to 6C, a description will be made of an ion implantation method of irradiating the wafer 7 with the ion beam while simultaneously controlling a wafer scanning region length for mechanically scanning the wafer 7 and a beam scanning speed in the beam scanning direction. As described in FIG. 4, if an ion implantation amount implanted into the wafer 7 is to be considered, for convenience of understanding, assuming that the wafer 7 stops, the ion beam irradiation region and the beam scanning speed may be considered relatively. Therefore, in FIG. 6A as well, for convenience of understanding, the wafer 7 is shown as if it stops.

As described in FIG. 5, in certain embodiments of the present invention, the wafer scanning region length for scanning the wafer 7 is configured to be continuously changed. Therefore, in FIG. 6A, the ion beam irradiation region extends over the entire surface of the wafer in the transverse direction, but ion implantation is performed only up to the middle part of the wafer 7 in the longitudinal direction. In other words, a range of the convenient ion beam irradiation region does not include the wafer shape. In addition, as is clear from FIG. 6B, the beam scanning speed V of the ion beam can be controlled so as to be continuously varied in the transverse direction of the wafer. In FIG. 6A, the wafer scanning region length is shown so as to exceed the wafer center, but this is an example, and the wafer scanning region length may not exceed the wafer center. Further, as is clear from FIG. 6B, the beam scanning speed V may be controlled (set) so as to become a valley type (indicated by C1, C2 and C5) at the central region of the wafer (the central region of the beam scanning range), conversely, may be controlled (set) so as to be a mountain type (C4) at the central region of the wafer, or may be controlled (set) such that a plurality of valleys and mountains (C3) exist from the end of the wafer to the central region of the wafer or so as to become asymmetric.

Here, with reference to FIG. 6C, a relationship between the beam scanning speed V and the ion implantation amount D will be described. When the beam scanning speed V is high, the ion implantation amount D implanted in a corresponding ion beam irradiation region for the unit time decreases in reverse proportion to the beam scanning speed V. In certain embodiments of the present invention, the beam scanning speed is actually controlled, but a purpose thereof is control of an ion implantation amount, and, hereinafter, discussion will be performed using the ion implantation amount unless particularly clearly indicated.

Figure 7:
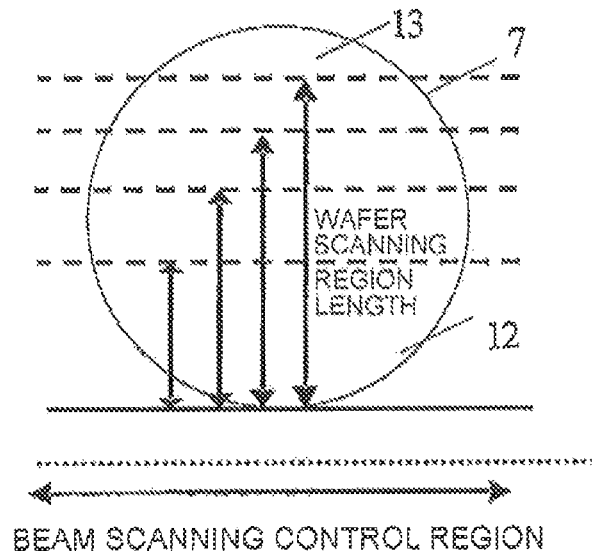
FIG. 7 is a diagram illustrating variability of the wafer scanning region length for mechanically scanning a wafer according to an embodiment of the present invention.

Next, with reference to FIG. 7, a description will be made of the wafer scanning region length for mechanically scanning the wafer 7. In certain embodiments of the present invention, the wafer scanning region length for mechanically scanning the wafer 7 can be set to be varied. In other words, the wafer scanning region length for scanning the wafer 7 may be set to be smaller than the wafer radius, or may be set to be larger than the wafer radius and smaller than the wafer diameter.

In the ion implantation method according to an embodiment of the present invention, since the wafer scanning region length for mechanically scanning the wafer is changed, there is a region into which ions are not implanted in the longitudinal direction of the wafer and a region into which ions are implanted in this step. Based on this great difference between ion implantation amounts in the two regions, as described later in detail, after executing an implantation method which is repeatedly performed multiple times while continuously changing a wafer rotation angle with respect to the ion beam, it is possible to realize a large-scale two-dimensional ion implantation amount in-surface distribution where a ratio of the maximum ion implantation amount to the minimum ion implantation amount is five times or more. In addition, in the region into which ions are implanted, a distribution can be intentionally generated in the ion implantation amounts depending on a position in the transverse direction of the wafer in response to the change in the beam scanning speed. Based on this distribution, as described later in detail, after executing an implantation method which is repeatedly performed multiple times while continuously changing a wafer rotation angle with respect to the ion beam, it is possible to control two control amounts of the degree of the dose amount non-uniformity in a wafer surface and a two-dimensional non-uniform shape pattern thereof independently from each other.

Next, certain embodiments of the present invention employs an implantation method in which an ion implantation where the wafer scanning region length and the beam scanning speed are simultaneously controlled is performed each time a wafer rotation angle with respect to the ion beam is changed and this is repeatedly performed multiple times during one rotation of the wafer.

Figures 8A, 8B:
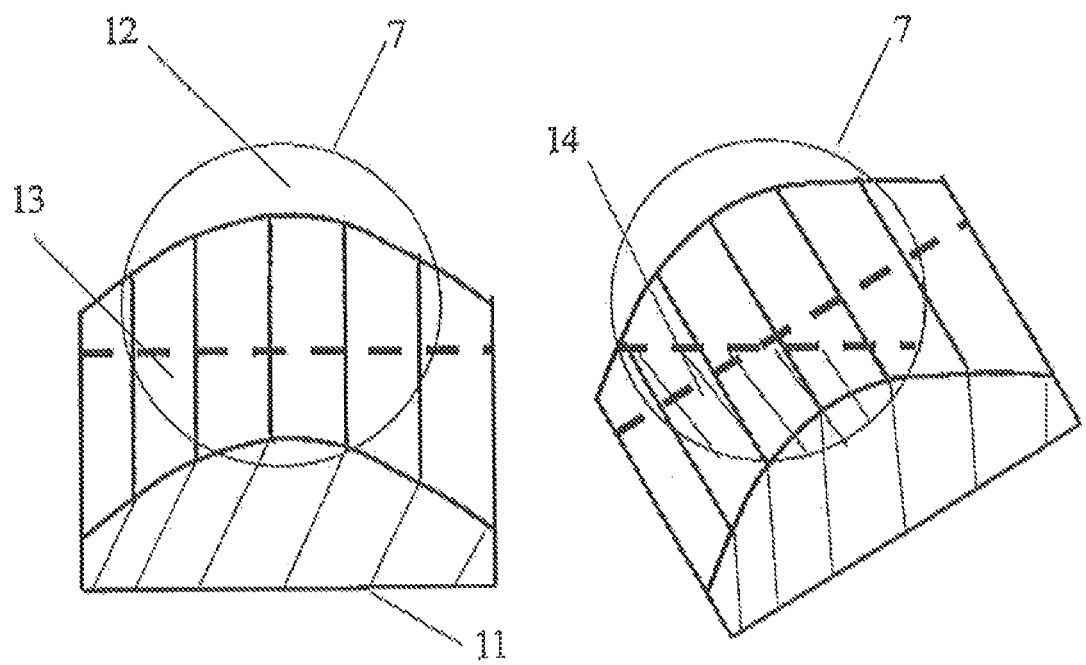
FIGS. 8A and 8B are diagrams illustrating an ion implantation scheme of repeatedly performing the ion implantation method of simultaneously controlling the wafer scanning region length and the beam scanning speed multiple threes while changing a wafer rotation angle with respect to an ion beam according to an embodiment of the present invention.
Figures 9A, 9B:
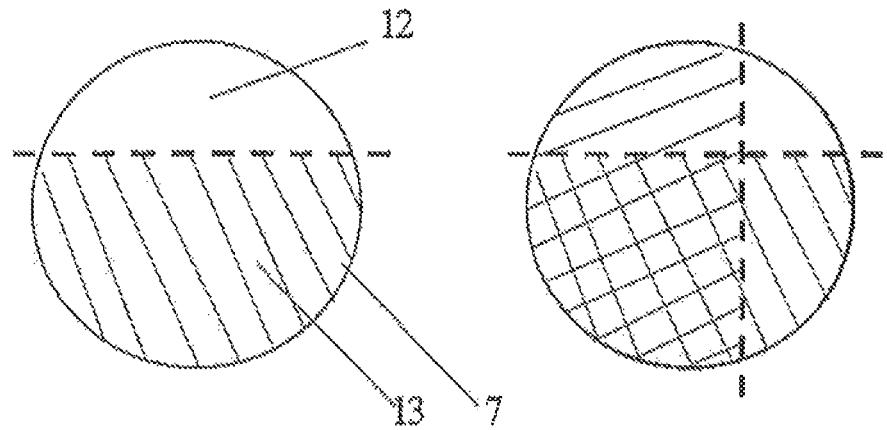
FIGS. 9A to 9E are diagrams illustrating an ion implantation scheme of repeatedly performing the ion implantation method of varying only the wafer scanning region length for mechanically scanning a wafer multiple times while changing a wafer rotation angle with respect to an ion beam according to an embodiment of the present invention.
Figures 9C, 9D:
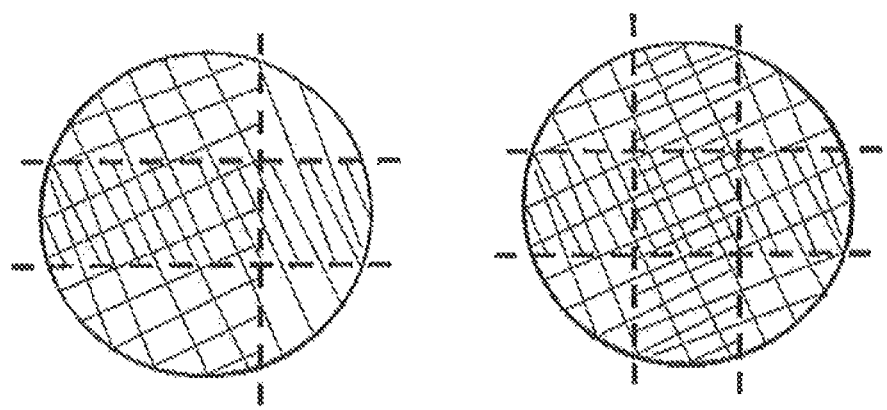
Figure 9E:
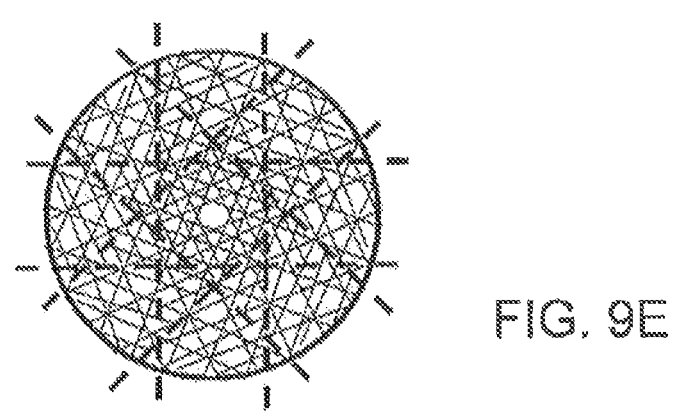
Figures 10A, 10B:
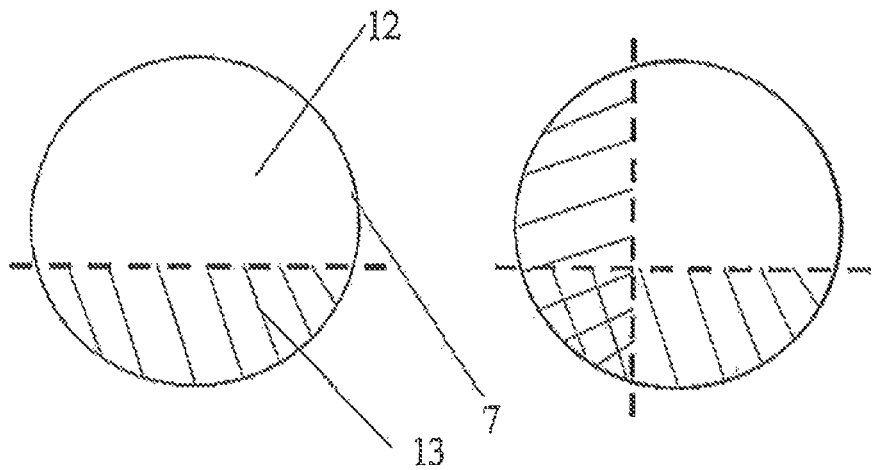
FIGS. 10A to 10E are diagrams illustrating, an ion implantation scheme of repeatedly performing the ion implantation method of varying only the wafer scanning region length for mechanically scanning a wafer multiple times while changing a wafer rotation angle with respect to an ion beam according to an embodiment of the present invention.
Figures 10C, 10D:
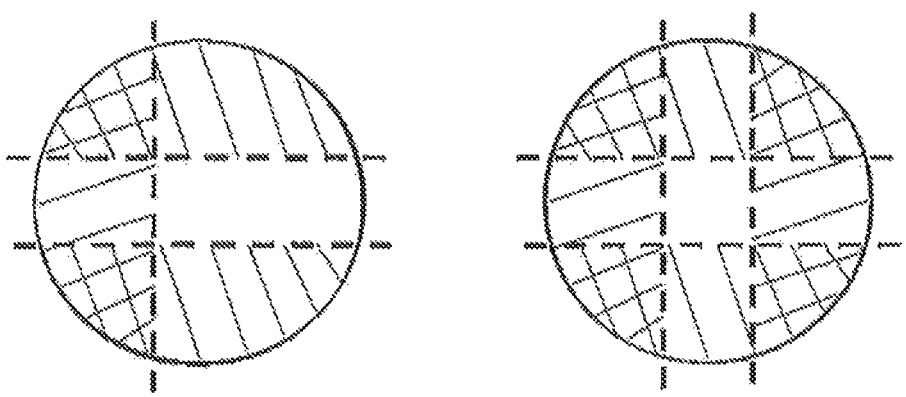
Figure 10E:
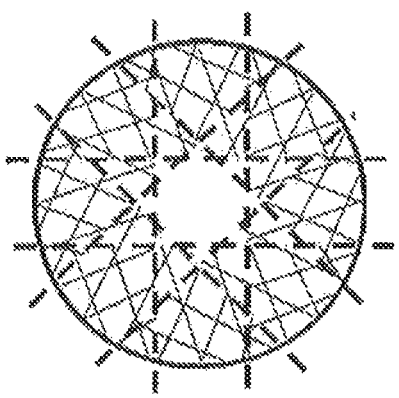
Figure 13A:
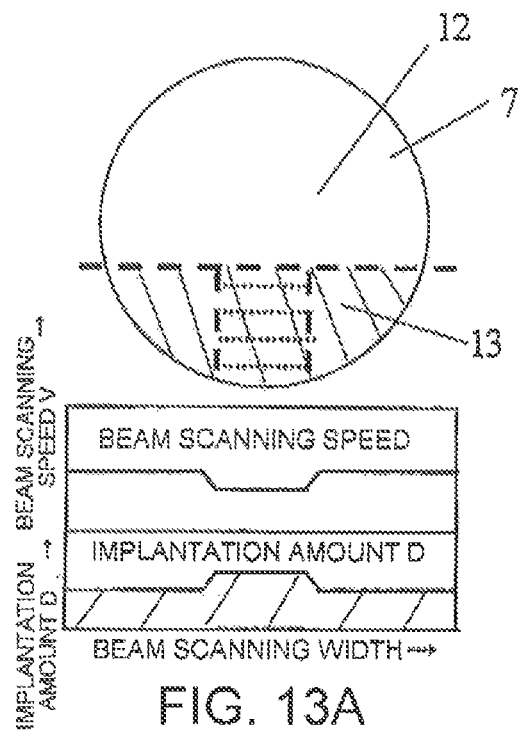
FIGS. 13A to 13E are diagrams illustrating an ion implantation scheme of performing the ion implantation method of simultaneously controlling the wafer scanning region length and the beam scanning speed each time a wafer rotation angle with respect to an ion beam is changed and of repeatedly performing it multiple times according to an embodiment of the present invention.
Figure 13B:
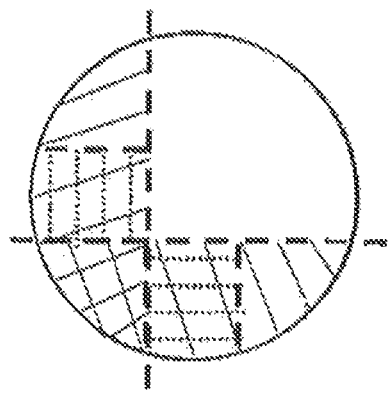
Figure 13C:
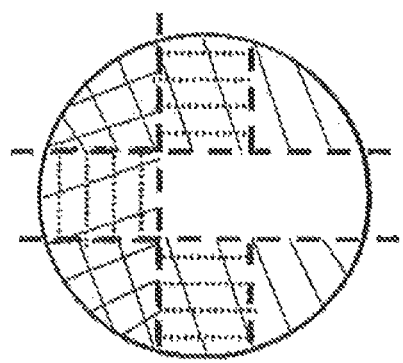
Figure 13D:
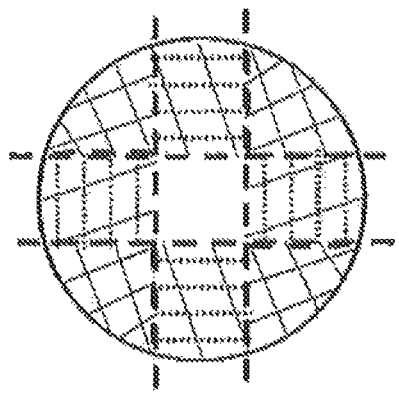
Figure 13E:
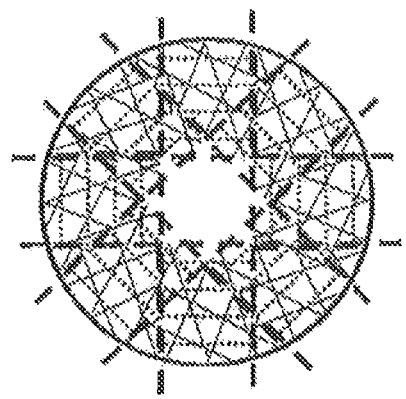

This implantation method will be described with reference to FIGS. 8A and 8B. In the ion implantation apparatus according to an embodiment of the present invention, as described in FIG. 2, the holder 8 is intermittently rotated at a set angle by the rotation device 9 rotating the holder 8, and, as a result, the wafer 7 held on the holder 8 can be intermittently rotated with respect to the ion beam at the set angle. However, if an ion implantation amount implanted into the wafer 7 is to be considered, a relative movement between the ion beam and the wafer 7 is problematic. Therefore, for convenience of understanding, assuming that the wafer 7 stops, the ion beam irradiation region may be considered to be rotated. In FIGS. 8A and 8B, the wafer 7 is shown so as to stop.

Figure 6A:
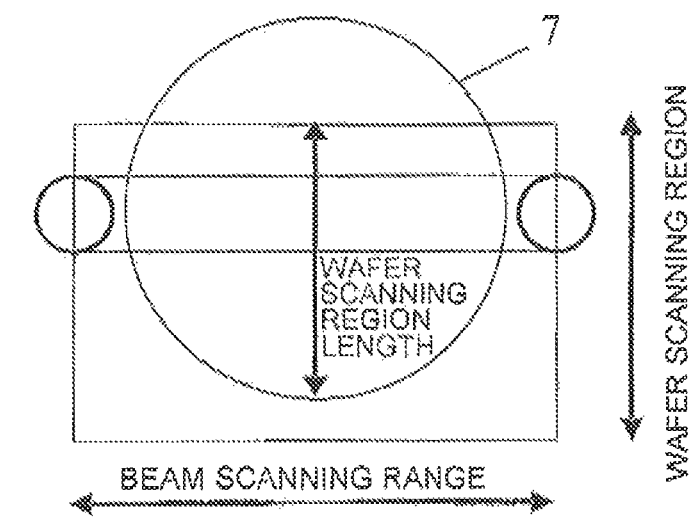
FIGS. 6A to 6C are diagrams illustrating an ion implantation method of irradiating a wafer with an ion beam while simultaneously controlling a wafer scanning region length for mechanically scanning a wafer and a beam scanning speed in a beam scanning direction according to an embodiment of the present invention.
Figure 6B:
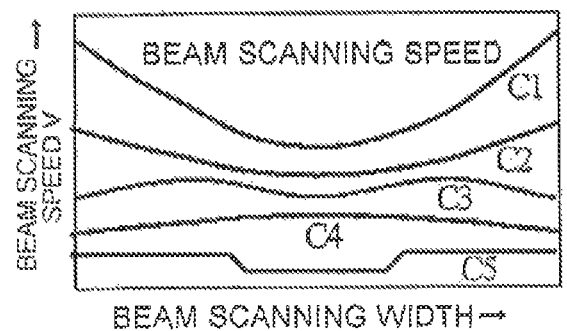
Figure 6C:
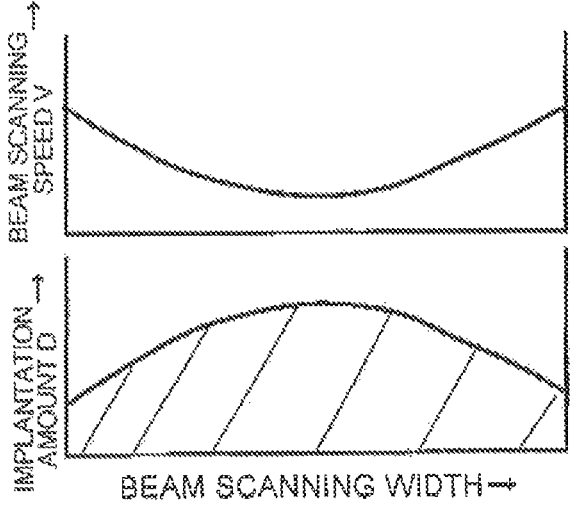

As described in FIGS. 6A to 6C, since certain embodiments of the present invention employ an implantation method of implanting ions into the wafer 7 while simultaneously controlling a water scanning region length for mechanically scanning the wafer 7 and an ion beam scanning speed, as a result, when the first implantation operation finishes, a region 12 into which ions are not implanted and a region 13 into which ions are implanted occur in the wafer 7. Here, an ion implantation amount in-surface distribution 11 occurs in the region 13 into which ions are implanted by control of the beam scanning speed according to certain embodiments of the present invention. In certain embodiments of the present invention, the implantation method is used in which a wafer rotation angle with respect to the ion beam is continuously changed, the above-described implantation operation is performed after the rotation stops, and this is repeatedly performed multiple times during one rotation of the wafer. Here, the multiple times are defined by set angles obtained by dividing 360 degrees of the wafer by n with the number of 2 to n times (where n is a positive integer). FIG. 8B shows an example of the second implantation operation. A region 14 into which ions are implanted in the first implantation operation is indicated by being hatched with the diagonal lines. In the second implantation operation as well, in the same manner as the first implantation operation, since there is use of the implantation method of implanting ions into the wafer 7 while simultaneously controlling a wafer scanning region length for mechanically scanning the wafer 7 and a beam scanning speed, a region into which ions are not implanted in the implantation operation and a region, having an implantation amount in-surface distribution, into which ions are implanted also occur in the wafer 7 in the second implantation operation. Since rotation angles of the wafer 7 with respect to the ion beam are varied in the first implantation operation and the second implantation operation (rotation in the counterclockwise direction in FIG. 5B), the region into which ions are not implanted in the wafer decreases. In addition, the ion implantation amount in-surface distribution is further formed in the region into which ions are implanted.

In certain embodiments of the present invention, although, in the continuously performed implantation operation, the wafer scanning region length for mechanically scanning the wafer is set to be continuously varied for each specific rotation angle, the same wafer scanning region length may be used. In addition, although the beam scanning speed in the beam scanning direction is also controlled so as to be continuously varied for each specific rotation angle, the same beam scanning speed pattern may be used.

By repeatedly performing the implantation operation multiple times, it is possible to realize a two-dimensional ion implantation amount in-surface distribution in the wafer surface while implanting ions into the entire surface region in the wafer surface. Since the wafer scanning region length for mechanically scanning the wafer 7 is controlled in certain embodiments of the present invention, it is possible to realize an intentional large-scale two-dimensional ion implantation amount in-surface distribution where a ratio of the maximum ion implantation amount to the minimum ion implantation amount in the wafer surface increases. Specifically, it is possible to realize a large-scale two-dimensional ion implantation amount in-surface distribution where a ratio of the maximum ion implantation amount to the minimum ion implantation amount is five times or more.

In order to describe the ion implantation method according to certain embodiments of the present invention more in detail, first, with reference to FIGS. 9A to 9E and 10A to 10E, a description will be made of an implantation method in which only the wafer scanning region length for mechanically scanning the wafer 7 is varied while rotating the wafer 7. In addition, hereinafter, in the description referring to FIGS. 9A to 9E, 10A to 10E, 11A to 11E, 12A to 12E, and 13A to 13E, A to D in the respective figures show results that an implantation operation where the wafer 7 is rotated by 90 degrees (set angle) in the clockwise direction and ions are implanted after the rotation stops is repeatedly performed four times, and E in the respective figures shows results that an implantation operation where the wafer 7 is rotated by 45 degrees (set angle) and ions are implanted after the rotation stops is repeatedly performed eight times. However, these are shown for convenience of the description and are not aimed at limitation. In addition, in the description referring to FIGS. 9A to 9E, 10A to 10E, 11A to 11E, 12A to 12E, and 13A to 13E, the wafer scanning region length for mechanically scanning the wafer is shown so as to be constant regardless of a wafer rotation angle, but this is shown for convenience of the description and is not aimed at limitation. Further, in the description referring to FIGS. 9A to 9E, 10A to 10E, 11A to 11E, 12A to 12E, and 13A to 13E, the beam scanning speed pattern in the beam scanning direction is shown so as to be constant regardless of a wafer rotation angle, but this is also shown for convenience of the description and is not aimed at limitation.

FIGS. 9A to 9E show an implantation method in which the wafer scanning region length for mechanically scanning the wafer 7 is set to be larger than the wafer radius and smaller than the wafer diameter, and only the wafer scanning region length is varied. In this case, as can be seen from FIGS. 9A to 9D, the implantation operation is continuously performed while rotating the wafer 7 by 90 degrees in the clockwise direction, and thereby the region where ions are not implanted into the wafer 7 decreases. An ion implantation amount distribution in the wafer surface when a series of implantation operations performed while rotating the wafer 7 by the set angle finish is the same as in FIG. 9E. Here, it is noted that, when only the wafer scanning region length is changed as in FIGS. 9A to 9E, since one kind of variable is changed, the degree of dose amount non-uniformity in the wafer surface and a two-dimensional non-uniform shape pattern thereof have a certain relationship.

This circumstance is also the same for a case using an implantation method in which, as shown in FIGS. 10A to 10E, the wafer scanning region length for mechanically scanning the wafer 7 is set to be smaller than the wafer radius and only the wafer scanning region length is varied. In other words, FIGS. 10A to 10E are the same as FIGS. 9A to 9E except that the wafer scanning region length is set to be smeller than the wafer radius.

To summarize, as in the ion implantation method shown in FIGS. 9A to 9E and 10A to 10E, since one kind of variable is changed if only the wafer scanning region length is changed, the degree of dose amount non-uniformity in the wafer surface and a two-dimensional non-uniform shape pattern thereof are correlated with each other and thus cannot freely move from each other. The degree of dose amount non-uniformity in the wafer surface and the two-dimensional non-uniform shape pattern thereof are important factors in non-uniformity in the wafer surface in other semiconductor manufacturing processes, and if each requirement cannot be satisfied independently, this is not compatible with a purpose of correcting the dose amount non-uniformity in the wafer surface in the other semiconductor manufacturing processes. Therefore, if only the wafer scanning region length is changed, it is not possible to realize a two-dimensional implantation amount in surface distribution with large-scale non-uniformity, which is to be realized by certain embodiments of the present invention, for the purpose of correcting dose amount non-uniformity in the wafer surface in the other semiconductor manufacturing processes.

Here, since certain embodiments of the present invention employ the implantation method of implanting ions into the wafer 7 while simultaneously controlling a wafer scanning region length for mechanically scanning the wafer 7 and a beam scanning speed in the beam scanning direction. In the implantation method shown in FIGS. 8A and 8B, two control amounts of the size of dose amount non-uniformity in the wafer surface and the two-dimensional non-uniform shape pattern thereof can be car trolled individually and independently. Therefore, it can be compatible with the purpose of correcting dose amount non-uniformity in the wafer surface in the other semiconductor manufacturing processes, which is to be realized by certain embodiments of the present invention. Hereinafter, a description will be made thereof for better understanding.

FIGS. 11A to 11E show an implantation method in which the wafer scanning region length for mechanically scanning the wafer 7 is set to be larger than the wafer radius and smaller than the wafer diameter, the wafer scanning region length is varied, and a beam scanning speed of the central region of the beam scanning range is lower than at other positions, according to an embodiment of the present invention. As described above, the ion implantation amount D is inversely proportional to the beam scanning speed V. Therefore, in the ion implantation in FIG. 11A, a region 12 into which ions are not implanted and a region 13 into which ions are implanted occur in the wafer 7, and an ion implantation amount in-surface distribution occurs in the region 13 into which ions are implanted such that the ion implantation amount D increases in the central region of the beam scanning range by the control of the beam scanning speed V. The same implantation operation is performed each time the wafer 7 is rotated, and thereby the region into which ions are not implanted in the wafer 7 gradually decreases. As described above, FIGS. 11A to 11D show results that the wafer 7 is, sequentially rotated by 90 degrees in the clockwise direction and four ion implantations in total are performed, and FIG. 11E shows an ion implantation amount distribution in the wafer surface after the ion implantation is performed while rotating the wafer 7 by 45 degrees eight times.

FIGS. 12A to 12E show an implantation method in which the wafer scanning region length for mechanically scanning the wafer 7 is set to be larger than the wafer radius and smaller than the wafer diameter, the wafer scanning region length is varied, and a beam scanning speed of the central region of the beam scanning range is higher than at other positions, according to an embodiment of the present invention. As described above, the ion implantation amount is inversely proportional to the beam scanning speed. Therefore, in the ion implantation in FIG. 12A, a region 12 into which ions are not implanted and a region 13 into which ions are implanted occur in the wafer 7, and an ion implantation amount in-surface distribution occurs in the region 13 into which ions are implanted such that the ion implantation amount decreases in the central region of the beam scanning range by the control of the beam scanning speed. In FIGS. 12A to 12E, the wafer scanning region length for mechanically scanning the wafer 7 is the same as that in FIGS. 11A to 11E. In FIGS. 11E and 12E, the light and shade in the wafer surface depending on presence or absence of hatching, broken lines and dots indicates that a dose amount in the wafer surface is non-uniform, that is, dose amount non-uniformity in the wafer surface, and a pattern formed by such light and shade indicates a two-dimensional non-uniform shape pattern. Therefore, as can be clearly seen from FIGS. 11E and 12E, even if the wafer scanning region length for mechanically scanning the wafer 7 is the same, the two control amounts of the degree of dose amount non-uniformity in the wafer surface and the two-dimensional non-uniform shape pattern thereof can be controlled individually and independently. That is to say, since certain embodiments of the present invention employ the implantation method of implanting lens into the wafer 7 while simultaneously controlling a wafer scanning region length for mechanically scanning the wafer 7 and a beam scanning speed in the beam scanning direction, the two control amounts of the degree of dose amount non-uniformity in the wafer surface and the two-dimensional non-uniform shape pattern thereof can be controlled individually and independently.

In FIGS. 11A to 11E and FIGS. 12A to 12E, although the implantation method where a beam scanning speed of the central region of the beam scanning range is lower than at other positions is compared with the implantation method where it is higher than at other position, a changing method of the beam scanning speed is not limited thereto. In other words, a changing method of the beam scanning speed may be in a form where a set speed thereof increases or decreases in a stepwise manner, or randomly increases or decreases. In addition, as described in FIG. 6B, the number of valleys and mountains of the beam scanning speed may be changed. Further, a pattern of the beam scanning speed may be generally changed.

FIGS. 13A to 13E show an implantation method in which the wafer scanning region length for mechanically scanning the wafer 7 is set to be smaller than the wafer radius, the wafer scanning region length is varied, and a beam scanning speed of the central region of the beam scanning range is lower than at other positions, according to an embodiment of the present invention. Here, for comparison, the beam scanning speed in FIGS. 11A to 11E and FIGS. 13A to 13E is the same. As can be clearly seen from FIGS. 11E and 13E, even if the beam scanning speed is the same, the two control amounts of the degree of dose amount non-uniformity in the wafer surface and the two-dimensional non-uniform shape pattern thereof can be controlled individually and independently. As described above, since certain embodiments of the present invention employ the implantation method of implanting ions into the wafer 7 while simultaneously controlling a wafer scanning region length for mechanically scanning the wafer 7 and an ion beam scanning speed in the beam scanning direction, the two control amounts of the degree of dose amount non-uniformity in the wafer surface and the two-dimensional non-uniform shape pattern thereof can be controlled individually and independently, which is also proved from the comparison of FIGS. 11A to 11E with FIGS. 13A to 13E.

As shown in FIGS. 13A to 13E, when the wafer scanning region length for mechanically scanning the wafer 7 is set to be smaller than the wafer radius, the region into which ions are not implanted occurs at the central region of the wafer after repeatedly performing the implantation operation multiple times while changing a wafer rotation angle with respect to the ion beam. A series of implantation operations may finish as a region with no ion implantation amount by regarding this region may be regarded as a case where the minimum ion implantation amount is zero, or, as necessary, a minute adjustment of the ion implantation amount distribution in the wafer surface may be performed by further performing uniform ion implantation for the entire surface of the wafer with a small ion implantation amount.

Since certain embodiments of the present invention employ the implantation method of implanting ions into the wafer 7 while simultaneously controlling a wafer scanning region length for mechanically scanning the wafer 7 and a beam scanning speed in the beam scanning direction, the two control amounts of the degree of dose amount non-uniformity in the wafer surface and the two-dimensional non-uniform shape pattern thereof can be controlled individually and independently; however, as a third control factor, a dose amount distribution in a direction where the wafer is mechanically scanned is further controlled, and thereby a minute adjustment of the ion implantation amount distribution in the wafer surface may be performed. In this case, the dose amount distribution in the direction where the wafer is mechanically scanned may be controlled by controlling a mechanical scanning speed for mechanically scanning the wafer 7, the dose amount distribution in the direction where the wafer is mechanically scanned may be controlled by changing and controlling a cycle of the beam scanning, or the dose amount distribution in the direction where the wafer is mechanically scanned may be controlled by intermittently omitting the time during which the wafer is irradiated with the ion beam.

To summarize once more, since certain embodiments of the present invention employ the implantation method of implanting ions into the wafer 7 while simultaneously controlling a wafer scanning region length for mechanically scanning the wafer 7 and a beam scanning speed in the beam scanning direction, the two control amounts of the degree of dose amount non-uniformity in the wafer surface and the two-dimensional non-uniform shape pattern thereof can be controlled individually and independently. Therefore, it is compatible with the purpose of correcting dose amount non-uniformity in the wafer surface in the other semiconductor manufacturing processes, which is to be realized by certain embodiments of the present invention.

Of course, as described above, the reason why a large-scale two-dimensional ion implantation amount in-surface distribution where a ratio of the maximum ion implantation amount to the minimum ion implantation amount in the wafer surface is five times or more can be realized is that the wafer scanning region length for mechanically scanning the wafer 7 is mainly changed. Therefore, it may be regarded that a broad (or rough) two-dimensional ion implantation amount in-surface distribution pattern is realized by varying the wafer scanning region length for mechanically scanning the wafer 7, and a detailed two-dimensional ion implantation amount in-surface distribution is realized by varying the beam scanning speed in the beam scanning direction.

As described above, when the entire surface of the wafer is irradiated with ion beams, ion implantation is possible such that a large-scale two-dimensional ion implantation amount in-surface distribution where a ratio of the maximum ion implantation amount to the minimum ion implantation amount in the wafer surface is five times or more can be realized for the purpose of correcting dose amount non-uniformity in the wafer surface in other semiconductor manufacturing processes.

Hereinafter, an example which has been actually realized according to certain embodiments of the present invention wig be described.

Figure 14:
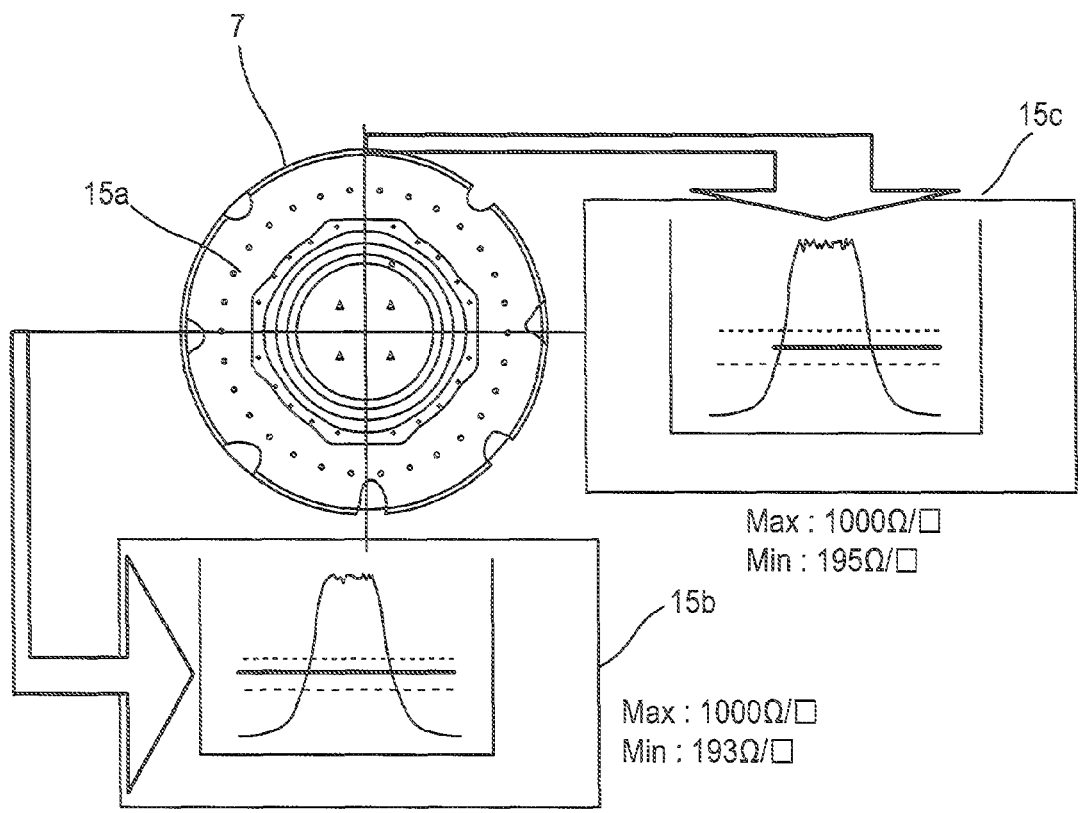
FIG. 14 is a diagram illustrating an example of the large-scale two-dimensional ion implantation amount in-surface distribution where a ratio of the maximum ion implantation amount to the minimum ion implantation amount in the wafer surface is five times or more, which has been actually obtained according to the embodiment of the present invention.

FIG. 14 shows an example of the ion implantation amount in-surface distribution which has been actually obtained according to the embodiment of the present invention. In this example, as a measured numerical value is smaller, an actual ion implantation amount increases in reverse proportion to the numerical value. In the example shown in FIG. 14, an ion implantation amount at the central region of the wafer is small, and an ion implantation amount is large at the end (or edge) region of the wafer. FIG. 14 shows 15a indicating a measured numerical value of the two-dimensional in-surface distribution in the wafer in a two-dimensional manner, and 15b and 15c indicating measured numerical distributions in two directions perpendicular to each other in the wafer surface.

As is clearly shown in FIG. 14, a ratio of the maximum value and the minimum value of the measured numerical values exceeds five times. As described above, since the measured numerical value is inversely proportional to the actual ion implantation amount, it is shown that a ratio of the maximum ion implantation amount to the minimum ion implantation amount in the actual wafer surface is five times or more in the example shown in FIG. 14. FIG. 14 shows an example but it can be seen that a large-scale two-dimensional ion implantation amount in-surface distribution where a ratio of the maximum ion implantation amount to the minimum ion implantation amount in the wafer surface is five times or more can be realized.

Figure 15:
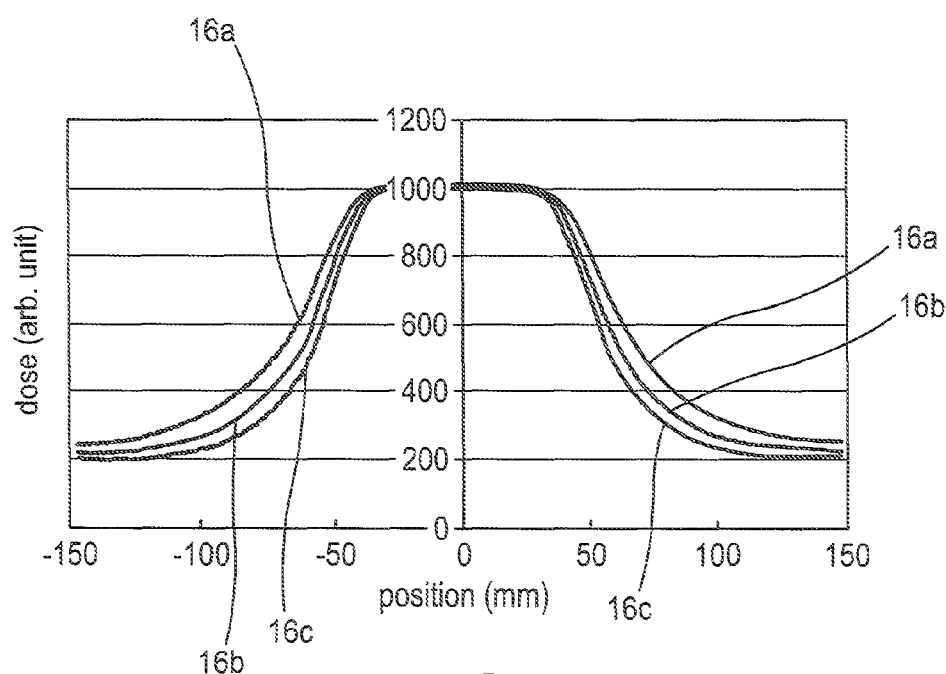
FIG. 15 is a diagram illustrating an example of the ion implantation amount distribution indicating that two control amounts of dose amount non-uniformity in a wafer surface and a two-dimensional non-uniform shape pattern thereof can be controlled independently from each other, which has been actually obtained according to the embodiment of the present invention.

With reference to FIG. 15, an example of the ion implantation amount distribution which has been actually obtained according to the embodiment of the present invention win be described. In FIG. 15, plots 16a, 16b and 16c of measured numerical values on certain straight lines of the wafer are shown, in the same manner as FIG. 14, in this example as well, as a measured numerical value is smaller, an actual ion implantation amount increases in reverse proportion to the numerical value. In the example shown in FIG. 15 as well, an ion implantation amount at the central region of the wafer is small, and an ion implantation amount is large at the end (or edge) region of the wafer.

The plots 16a, 16b and 16c in FIG. 15 indicate an example of the implantation operation where an implantation method of variously changing a beam scanning speed while the wafer scanning region length for mechanically scanning the wafer 7 is the same is repeatedly performed multiple times while varying a wafer rotation angles with respect to the ion beam. As is clear from FIG. 15, in a case where the degree of dose amount non-uniformity in the wafer surface is the same, a two-dimensional non-uniform shape pattern thereof can be varied.

FIG. 15 shows an example where two control amounts of the degree of dose amount non-uniformity in the wafer surface and the two-dimensional non-uniform shape pattern thereof can be controlled individually and independently. As described with reference to FIGS. 11A to 13E, even in a case where a two-dimensional non-uniform shape pattern is the same in contrast to the circumstance shown in FIG. 15, needless to say, it is possible to vary the degree of the dose amount non-uniformity in the wafer surface.

In addition, generally, it can be said that FIG. 15 shows an example where a broad (or rough) two-dimensional ion implantation amount in-surface distribution pattern is realized by varying the wafer scanning region length for mechanically scanning the wafer 7, and a detailed two-dimensional ion implantation amount in-surface distribution is realized by varying the beam scanning speed in the beam scanning direction.

As described above, according to certain embodiments of the present invention, when the ion beam is applied to the entire surface of the wafer, it is actually shown that a large-scale two-dimensional ion implantation amount in-surface distribution can be realized for the purpose of correcting dose amount non-uniformity in the wafer surface in other semiconductor manufacturing processes.

Although at least one exemplary embodiment has been described hitherto, the description is only an example and is not intended to limit the scope of the invention.

It should be understood that the invention is not limited to the above-described embodiment, but may be modified into various forms on the basis of the spirit of the invention. Additionally, the modifications are included in the scope of the invention.

What is claimed is:

1. An ion implantation method in which an ion beam is scanned in a beam scanning direction and a wafer is mechanically scanned in a direction perpendicular to the beam scanning direction so as to implant ions into the wafer, the method comprising:
    setting a wafer rotation angle with respect to the ion beam in a stepwise manner to implant ions into the wafer at each of a set wafer rotation angles; and
    implanting the ions into the wafer forming a central region in the wafer overlapping a portion of a range where the wafer is mechanically scanned to obtain a two-dimensional ion implantation amount in-surface distribution pattern where a ratio of a maximum to a minimum ion implantation amount is five times or more, the central region representing the maximum or the minimum ion implantation amount corresponding to a defined relationship among a diameter of the wafer, a wafer scanning region length, and a radius of the wafer,
    wherein, when the central region represents the minimum ion implantation amount and a plurality of ion implantation regions that overlap as the wafer is rotated, the implanting comprises:
        during a first step of the implanting, setting the wafer scanning region length to be shorter than the radius of the wafer,
        during a second step of the implanting, simultaneously varying the wafer scanning region length for regulating the range where the wafer is mechanically scanned, and changing a beam scanning speed of the ion beam to be lower in the central region than other positions of the wafer at each of the set of wafer rotation angles, and
        during a third step of the implanting, continuously repeating the second step for a full rotation of the wafer,
    wherein, when the central region represents the maximum ion implantation amount and a plurality of ion implantation regions that overlap as the wafer is rotated, the implanting comprises:
        during a first step of the implanting, setting the wafer scanning region length to be longer than the radius of the wafer,
        during a second step of the implanting, simultaneously varying the wafer scanning region length for regulating the range where the wafer is mechanically scanned, and changing a beam scanning speed of the ion beam to be lower in the central region than other positions of the wafer at each of the set of wafer rotation angles, and
        during a third step of the implanting, continuously repeating the second step for a full rotation of the wafer.

2. The ion implantation method according to claim 1, wherein the wafer scanning region length is set to be continuously varied for each specific angle with regard to the set of wafer rotation angles.

3. The ion implantation method according to claim 1, wherein the beam scanning speed of the ion beam is continuously set for each specific angle with regard to the set of the wafer rotation angles.

4. The ion implantation method according to claim 1, wherein two control amounts of the degree of dose amount non-uniformity in the wafer surface and a two-dimensional non-uniform shape pattern thereof are controlled independently from each other by simultaneously controlling two control parameters of the variable setting of the wafer scanning region length and the setting in the beam scanning speed of the ion beam.

5. The ion implantation method according to claim 4, wherein the broad two-dimensional ion implantation amount in-surface distribution pattern is realized by at least varying the wafer scanning region length and a detailed two-dimensional ion implantation amount in-surface distribution is realized by varying the beam scanning speed of the ion beam, thereby controlling the two control amounts of the degree of dose amount non-uniformity in the wafer surface and the two-dimensional non-uniform shape pattern independently of each other.

6. The ion implantation method according to claim 1, wherein the broad two-dimensional ion implantation amount in-surface distribution where the ratio of the maximum ion implantation amount to the minimum ion implantation amount in the wafer surface is five times or more is realized by implanting ions into the wafer surface while forming the central region into which the ions are not implanted in ion implantation at each of the set angle of the wafer rotation angles.

7. The ion implantation method according to claim 1, wherein the wafer scanning region length is smaller than the radius of the wafer.

8. The ion implantation method according to claim 1, wherein the wafer scanning region length is larger than the radius of the wafer and smaller than the diameter of the wafer.

9. The ion implantation method according to claim 1, wherein the minimum ion implantation amount is non-zero.

10. The ion implantation method according to claim 1, further comprising repeatedly performing the ion implantation method on the wafer for at least a plurality of times, where the plurality of times is determined based on the set wafer rotation angles that are obtained by dividing 360 degrees of the wafer by n (n≥2), where n is a positive integer.

11. An ion implantation apparatus which includes a beam scanner scanning an ion beam in a beam scanning direction and a mechanical scanning system mechanically scanning a wafer in a direction perpendicular to the beam scanning direction and implant ions into the wafer, the ion implantation apparatus comprising:
    a rotation device that is provided in the mechanical scanning system and varies a wafer rotation angle with respect to the ion beam; and
    a controller that has a function of controlling at least the beam scanner and the mechanical scanning system,
    wherein the controller is configured to:
        set a wafer rotation angle with respect to the ion beam in a stepwise manner to implant ions into the wafer at each of a set wafer rotation angles; and
        implant the ions into the wafer forming a central region in the wafer overlapping a portion of a range where the wafer is mechanically scanned to obtain a two-dimensional ion implantation amount in-surface distribution pattern where a ratio of a maximum to a minimum ion implantation amount is five times or more, the central region representing the maximum or the minimum ion implantation amount corresponding to a defined relationship among a diameter of the wafer, a wafer scanning region length, and a radius of the wafer,
    wherein, when the central region represents the minimum ion implantation amount and a plurality of ion implantation regions that overlap as the wafer is rotated, the controller is configured to the ions into the wafer by:
setting the wafer scanning region length to be shorter than the radius of the wafer during a first step of the implanting,
during a second step of the implanting, simultaneously varying the wafer scanning region length for regulating the range where the wafer is mechanically scanned, and changing a beam scanning speed of the ion beam to be lower in the central region than other positions of the wafer at each of the set of wafer rotation angles, and
during a third step of the implanting, continuously repeating the second step for a full rotation of the wafer,
wherein, when the central region represents the maximum ion implantation amount and a plurality of ion implantation regions that overlap as the wafer is rotated, the controller is configured to the ions into the wafer:
setting the wafer scanning region length to be longer than the radius of the wafer during a first step of the implanting,
during a second step of the implanting, simultaneously varying the wafer scanning region length for regulating the range where the wafer is mechanically scanned, and changing a beam scanning speed of the ion beam to be lower in the central region than other positions of the wafer at each of the set of wafer rotation angles, and
during a third step of the implanting, continuously repeating the second step for a full rotation of the wafer.

12. The ion implantation apparatus according to claim 11, wherein the controller further performs uniform ion implantation for the entire surface of the wafer with a reduced ion implantation amount in addition to the adjustment of ion implantation amount distribution in the wafer surface, thereby performing an additional adjustment of ion implantation amount distribution in the wafer surface.

13. The ion implantation apparatus according to claim 11, wherein the wafer scanning region length is smaller than the radius of the wafer.

14. The ion implantation apparatus according to claim 11, wherein the wafer scanning region length is larger than the radius of the wafer and smaller than the diameter of the wafer.

* * * * *